United States Patent
Davidovici

(10) Patent No.: US 8,860,857 B2
(45) Date of Patent: *Oct. 14, 2014

(54) SYSTEM AND METHOD FOR A HIGH PERFORMANCE COLOR FILTER MOSAIC ARRAY

(75) Inventor: Sorin Davidovici, Oceanport, NJ (US)

(73) Assignee: RJS Technology, Inc., Hollis, NH (US)

(*) Notice: Subject to any disclaimer, the term of this patent is extended or adjusted under 35 U.S.C. 154(b) by 172 days.

This patent is subject to a terminal disclaimer.

(21) Appl. No.: 13/004,972

(22) Filed: Jan. 12, 2011

(65) Prior Publication Data

US 2011/0109777 A1    May 12, 2011

Related U.S. Application Data

(63) Continuation of application No. 11/549,199, filed on Oct. 13, 2006, now Pat. No. 7,872,681.

(51) Int. Cl.
| | |
|---|---|
| *H04N 3/14* | (2006.01) |
| *G02B 5/20* | (2006.01) |
| *G02F 1/1335* | (2006.01) |
| *H04N 9/04* | (2006.01) |
| *H04N 5/335* | (2011.01) |
| *H01L 27/146* | (2006.01) |

(52) U.S. Cl.
CPC .......... *G02F 1/133514* (2013.01); *G02B 5/201* (2013.01); *H01L 27/14621* (2013.01); *G02F 2201/52* (2013.01); *H04N 9/045* (2013.01); *H04N 2209/045* (2013.01)
USPC ........................................... 348/280; 348/273

(58) Field of Classification Search
USPC ......................................... 348/275, 273, 280
See application file for complete search history.

(56) References Cited

U.S. PATENT DOCUMENTS

| | | | | |
|---|---|---|---|---|
| 5,579,047 | A * | 11/1996 | Yamagami et al. | 348/242 |
| 5,703,641 | A * | 12/1997 | Watanabe | 348/274 |
| 6,476,865 | B1 * | 11/2002 | Gindele et al. | 348/277 |
| 6,885,398 | B1 * | 4/2005 | Sladen | 348/273 |
| 7,480,000 | B2 * | 1/2009 | Oda | 348/321 |
| 7,663,679 | B2 * | 2/2010 | Wada | 348/277 |
| 8,049,806 | B2 * | 11/2011 | Feldman et al. | 348/340 |
| 8,253,830 | B2 * | 8/2012 | Endo et al. | 348/272 |
| 2004/0105021 | A1 * | 6/2004 | Hu | 348/272 |
| 2006/0139648 | A1 * | 6/2006 | Sachse et al. | 356/437 |

* cited by examiner

*Primary Examiner* — Ngoc-Yen Vu
(74) *Attorney, Agent, or Firm* — Lindsay G. McGuinness

(57) ABSTRACT

A method of implementing high-performance color filter mosaic arrays (CFA) using luminance pixels. The introduction of luminance pixels greatly improves the accuracy of the image acquisition process for a given pixel and image sensor size.

9 Claims, 5 Drawing Sheets

SYSTEM AND METHOD FOR A HIGH PERFORMANCE COLOR FILTER MOSAIC ARRAY

RELATED APPLICATIONS

This application claims priority under 35 U.S.C. §1.119(e) to provisional application 60/725,334, filed Oct. 13, 2005 by Sorin Davidovici, and further to application Ser. No. 11/549,199 filed Oct. 13, 2006, both incorporated herein by reference.

FIELD OF THE INVENTION

This invention relates generally to the field of photometry and more particularly to a high-performance color filter mosaic arrays (CFA).

BACKGROUND OF THE INVENTION

Photometry deals with the measurement of visible light. The human eye can only see light in the visible spectrum and has different sensitivities to light of different wavelengths within the spectrum. When adapted for bright conditions (photopic vision), the eye is most sensitive to greenish-yellow light at 555 nm.

The human eye has three types of color receptor cells (cones) that respond to incident radiation with different spectral response curves. A fourth type of cell (rod) is also present but it plays no role in color vision. The existence of exactly three types of color receptor cells implies that three numerical components are necessary and sufficient to describe a perceived color.

Digital images are comprised of a number of picture elements or pixels. Pixel values in color images are specified by tristimulus values. Tristimulus values are the amounts of three primaries that specify a perceived color. The colors red, green and blue form a preferred set of three primary colors.

A pixel is, generally, the smallest addressable unit of an image on a solid state imager, display screen or in a bit-mapped image. They are rated by their number of horizontal and vertical pixels; for example, 1024×768 means 1024 pixels are displayed in each row, and there are 768 rows (lines). Many image-acquisition and display systems are not capable of displaying the different color channels at the same site. This approach is generally resolved by using multiple sub-pixels, each of which handles a single color channel. With color systems, each pixel usually contains values for at least three, e.g., red, green and blue, subpixels.

It is desirable to reduce the average number of physical subpixels contained within one image sensor pixel, and hence image sensor silicon area, while not significantly reducing image quality. The most widespread method to give red, green and blue color sensitivity to image sensors is the application of a color filter mosaic array (CFA) on top of an image sensor. The CFA comprises an array of filters. Each filter limits the wavelengths of light that is provided to their associated image sensor. The most common implementation is the three color red, green, blue (RGB) pattern. Other color implementations exist such as three-color, e.g., yellow, magenta, cyan, complementary patterns or mixed primary/complementary colors and four color systems where the fourth color is a white or a color with shifted spectral sensitivity.

Although many criteria of a technical and physical implementation nature could be applied to choose a CFA pattern some of the most important are immunity to color artifacts and moiré patterns, minimization of pattern interaction with image sensor imperfections, color reconstruction computational complexity and immunity to optical and electrical cross talk between neighboring pixels. Preferred candidate color patterns should therefore have all three, red, green and blue, components available in the neighborhood of each pixel, each pixel should have the same number of neighbors of a given color and diagonal pixel alignment is desirable whenever possible.

FIG. 1 illustrates one of the most common CFA patterns in use today, the Bayer pattern. Each pixel is covered with an individual red, green or blue filter. Thus each image sensor, or pixel, captures only one color; full color values for each pixel are determined by interpolation using surrounding pixel values. Pixels 110 (red), 120 and 130 (green) and 140 (blue) form a basic Bayer pattern that is repeated multiple times to instantiate a practical image sensor. Compared to a monochrome sensor with the same pixel count and dimensions, the CFA approach lowers the available spatial resolution by roughly 30% to 40% and it requires interpolation calculations to reconstruct the color values for each pixel.

While the RGB color model is sufficient for computer graphics rendering of images, it is widely recognized that the YUV color model more accurately models the human perception of color. The YUV color model defines a color space in terms of one luminance (Y) and two chrominance (UV) components (saturation and hue). Digital cameras typically convert the RGB pixel values into YUV components using a picture reconstruction process that approximates the luminance (Y) channel by the green (G) pixels. The luminance for the non-G pixels is approximated by simple interpolation. The chrominance of the red and blue pixels is calculated as $Cr=R-Y$ and $Cb=B-Y$ using the approximate luminance values. The Cr and Cb values are spatially filtered and the missing values are obtained by interpolation. At this time all pixel should have their luminance and chrominance values and their RGB values are computed by $R=Y+Cr$, $B=Y+Cb$ and G from $Y=(R+G+B)/3$ or from $Y=0.2R+0.7G+0.1B$ or from some other similar formula. It is apparent from the above that the Bayer CFA approach trades off accuracy and resolution for simplicity.

Although many variants exist on the above method of deriving individual pixel color they all suffer from the fundamental limitation of the Bayer CFA that luminance is not directly available, but rather must be recreated from dispersed green, red and blue chroma information. Because the human eye is most sensitive to luminance information, the images provided using prior art methods are sub-optimal.

SUMMARY OF THE INVENTION

According to one aspect of the invention, a pixel includes a luminance filter comprising a plurality of colors, wherein the size of each of the colors of the luminance filter is proportional to a share of the color used to calculate luminance using the plurality of colors.

According to another aspect of the invention, a color filter array includes a luminance pixel, the luminance pixel comprising a luminance filter including a plurality of colors, wherein the size of each of the colors of the luminance filter is proportional to a share of the color used when calculating luminance using the plurality of colors.

With such an arrangement, luminance information can be directly measured at each pixel, thereby providing a resultant output image with high resolution and accuracy. These and other advantages of the present invention will be described in more detail below with regard to the attached Figures.

DETAILED DESCRIPTION

According to one aspect of the invention, a luminance filter is provided which will enable luminance pixel information to be directly obtained for an image using a Color Filter Array (CFA). The introduction of luminance pixels greatly improves the accuracy of the image acquisition process for a given pixel and image sensor size. Using the luminance filters of the present invention, luminance can be accurately captured at high resolution with high accuracy. Further objects and advantages of my invention will become apparent from a consideration of the drawings and ensuing description.

One aspect of the invention is the realization that even though the human eye is more sensitive to pixel luminance information then to pixel chrominance information, this fact which is not exploited by the Bayer CFA. An improved CFA design of the present invention emphasizes luminance information acquisition over chrominance information acquisition—greatly improving the overall perceptual picture quality and reducing the sensor silicon area requirement for a given image acquisition resolution requirement. A luminance (Y) pixel mask, provided in any one of a number of varieties, may be used to directly acquire luminance information.

The luminance pixel includes a luminance (Y) mask which is positioned over an image sensor to allow the image sensor to directly extract luminance data from received light wavelengths. The present invention therefore removes complexity and inaccuracies inherent in the interpolated process of the prior art, while providing high resolution output.

Figure 1:
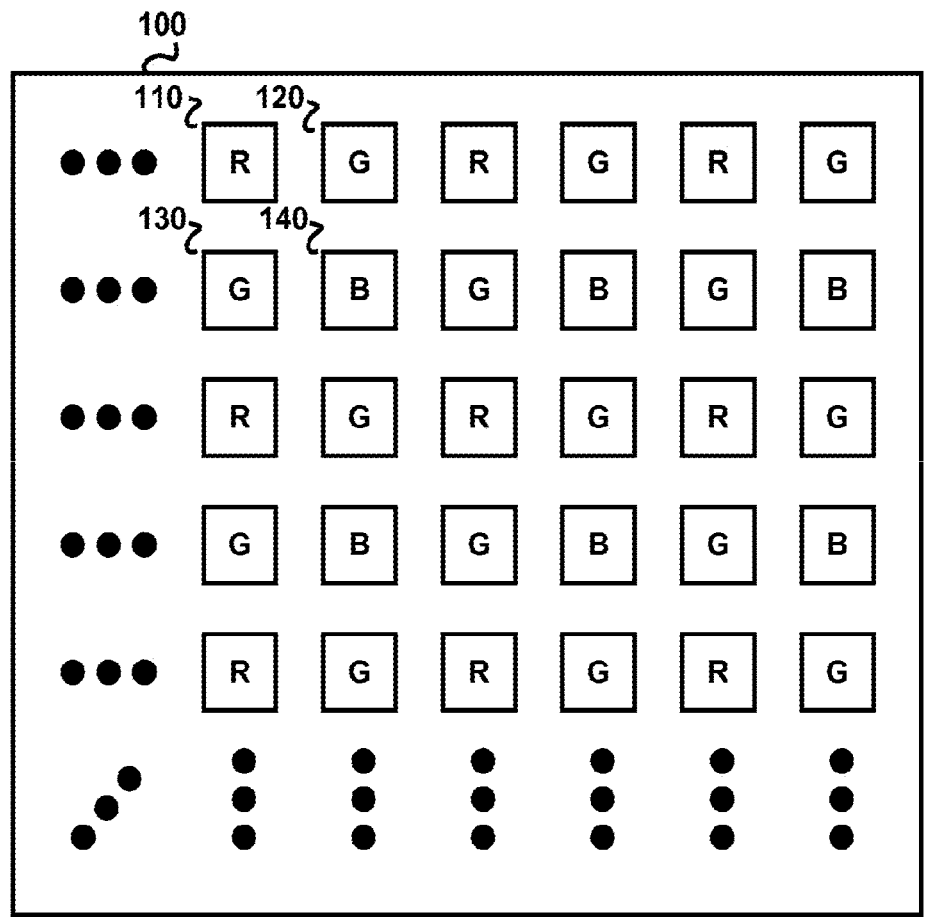
FIG. 1 is a diagram of a Bayer pattern Color Filter Array of the prior art.
Figure 2A:
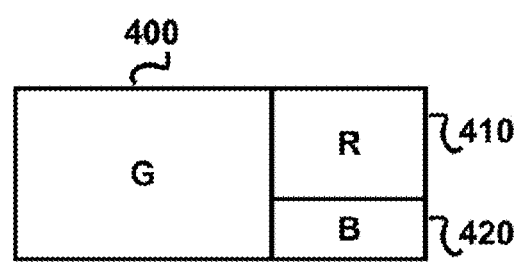
FIG. 2 is a diagram illustrating several embodiments of a luminance (Y) filter of the present invention.
Figure 2B:
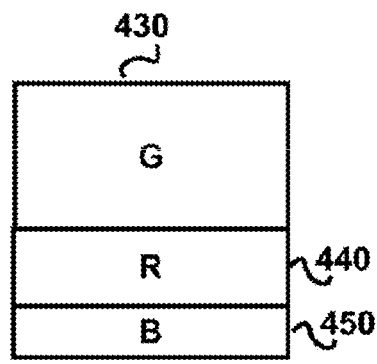
Figure 2C:
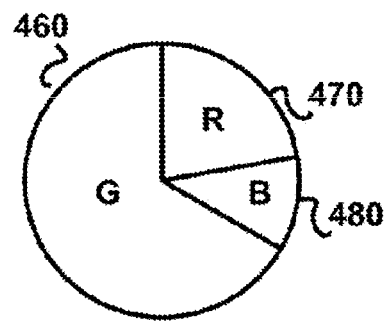

FIGS. 2A-2C illustrate several optical filter mask patterns for the Y pixel. Although the Y pixel masks illustrated in FIGS. 2A-C utilize red, green and blue components, these components are provided by way of example only. Other color combinations, such as three-color, e.g., yellow, magenta, cyan, complementary patterns or mixed primary and complementary colors or four color systems where the fourth color is a white or a color with shifted spectral sensitivity or other color combinations could be implemented as well, and the present invention is not limited to any particular color combination.

The optical filter mask may be formed from a sheet of dyed glass, gelatin, plastic or other material used to absorb certain colors and permit better rendition of others. The specific shape and pattern of the optical filter masks illustrated in FIGS. 2A-2C are not significant as long as the resultant proportions of the filtered colors are maintained. The Y pixel definition assumed here is Y=0.2R+0.7G+0.1B. Thus the red area of the filter is twice as large as the blue area of the filter and the green area of the filter is seven times as large as the blue area of the filter. Other ratios of component colors could be used as well, according, among other factors, to the assumed human vision characteristics.

The shape of the pixels illustrated in FIGS. 2A-2C is arbitrary. FIG. 2A illustrates a rectangular pixel, FIG. 2B a square and FIG. 2C a circular pixel shape but other shapes which may be dictated by particular designs are included within the scope of this invention as equivalents.

Figure 3:
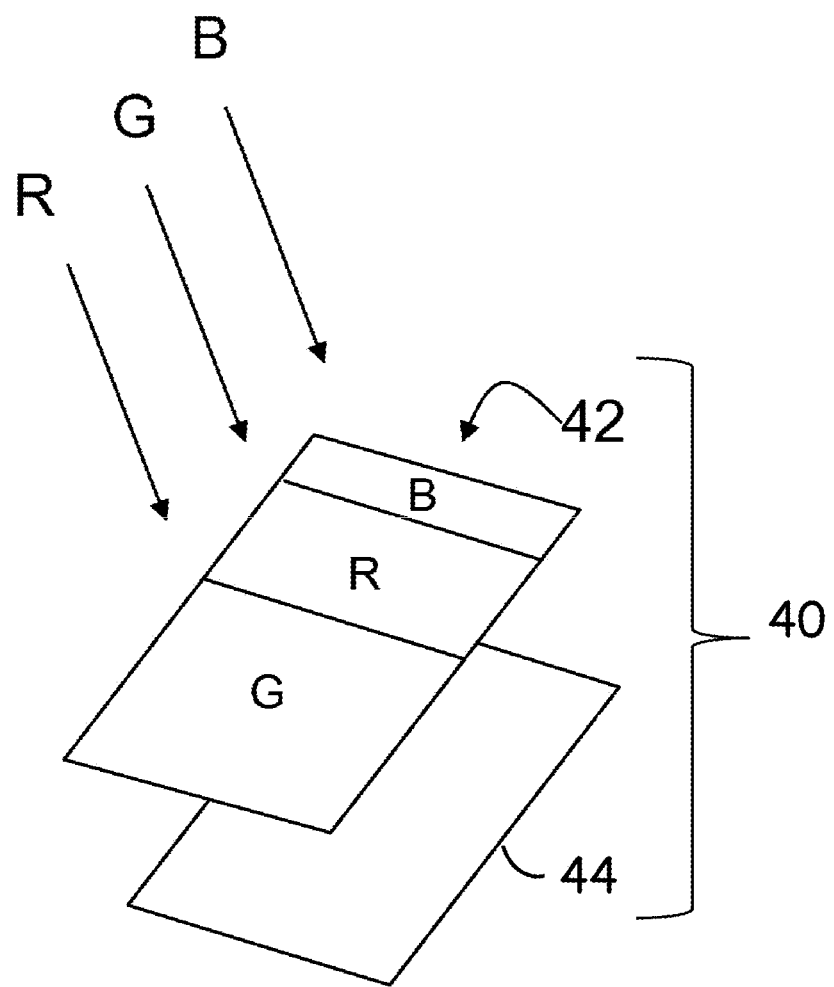
FIG. 3 is a high level block diagram illustrating components of a luminance pixel of the present invention.

FIG. 3 is a diagram provided to illustrate components of a Y pixel of the present invention. The Y pixel 40 includes a Y pixel mask 42 and an image sensor 44. The Y pixel mask is a mask which includes a color filter having multiple colors, with the size of each one of the multiple colors of the mask being selected in accordance with a proportion of the color wavelength that is included in a luminance calculation. The image sensor may be implemented using a CCD (charge-coupled device) or CMOS (complementary metal oxide semiconductor) technology. In a preferred embodiment, the image sensor is a High Dynamic Range Sensitive mage Sensor such as that disclosed in patent application Ser. No. 11/533,866 or a High Dynamic Range Sensitive Sensor with Gain Control such as that disclosed in patent Ser. No. 11/533,870, both filed Sep. 21, 2006 by Davidovici, and incorporated herein by reference. As shown in FIG. 3, as light impinges on the pixel mask, the photons associated with the image will be provided to the image sensor in proportion to the luminance value of the image.

Figure 4:
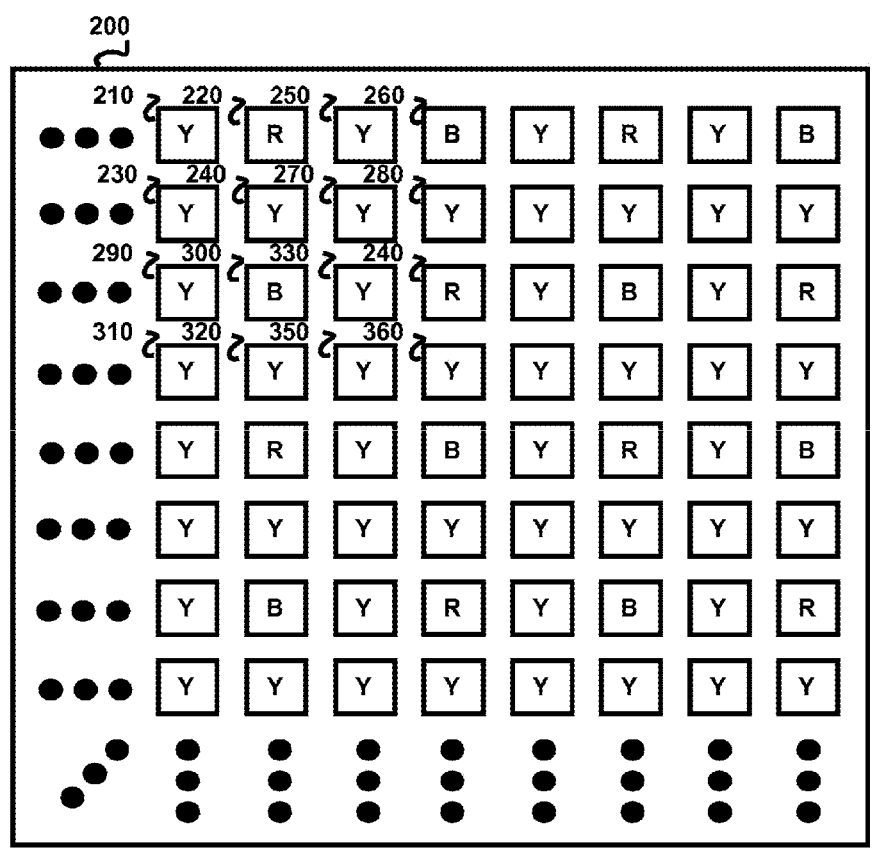
FIG. 4 is a diagram of one embodiment of a Color Filter Array using the luminance filter of FIG. 2.

The luminance pixels of FIGS. 2A-2C, or their equivalents may be arranged in a variety of patterns with a variety of other types of pixels in a Color Filter Array. One preferred embodiment of a luminance (or Y) based CFA pattern is illustrated in FIG. 4. Pixels 210, 230, 250, 270, 280, 290, 310, 320, 330, 340, 250 and 360 (Y, or luminance pixels), 220, 240 (red pixels) and 260, 300 (blue pixels) form the basic pattern that is repeated multiple times to instantiate a practical image sensor. This preferred CFA pattern exploits the psychovisual properties of the human eye and eliminates drawbacks associated the Bayer CFA pattern.

The introduction of the Y pixels also serves to directly increase the image resolution. As evident in FIG. 4 each chroma pixel, i.e. red (R) or blue (B), is surrounded by luminance (Y) pixels. The availability of luminance information from all spatial directions ensures accurate recovery of luminance information at the chroma pixel locations. By way of example, luminance values at chroma pixel location can be derived using well known methods based on interpolation or mathematical techniques.

As evident in FIG. 4 each luminance pixel is bordered by either two or four chroma pixels. The proximity of chroma information to the luminance pixels ensures accurate recovery of chrominance information at the luminance pixel locations using well known methods based on interpolation or other mathematical techniques. The presence of chroma information within the luminance pixel value will further aid the accurate recovery of chrominance information at luminance pixel locations.

Figure 5:
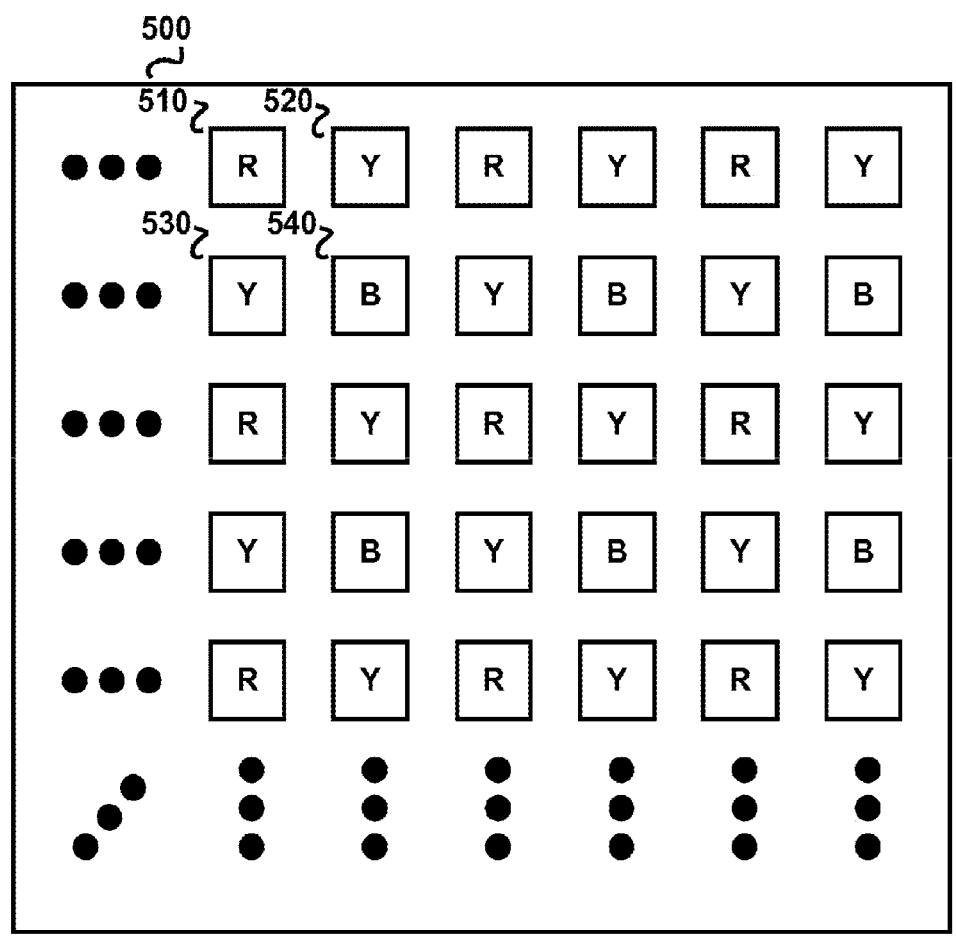
FIG. 5 is a diagram of a second embodiment of a Color Filter Array of the present invention that uses the luminance filter of FIG. 2.

Yet another preferred CFA implementations utilizing the disclosed luminance pixels is illustrated in FIG. 5. Pixels 500 (red pixel), 540 (blue pixel) and 520, 530 (Y pixels) form the basic pattern that is repeated multiple times to instantiate a practical image sensor. This preferred CFA pattern also exploits the psychovisual properties of the human eye and eliminated drawbacks associated the Bayer CFA pattern. The new Y pixels which are composed of a mixture of green and red and blue information are introduced. Y pixels directly contain the luminance information to which the human eye is most sensitive therefore increasing the effective resolution of the image sensor.

As evident in FIG. 5 each luminance pixel is bordered by four chroma pixels. The proximity of chroma information to the luminance pixels ensures accurate recovery of chrominance information at the luminance pixel locations using well known methods based on interpolation or other mathematical techniques. The presence of chroma information within the luminance pixel value will further aid the accurate recovery of chrominance information at luminance pixel locations.

Accordingly, the present invention is related to a method of implementing CFA filters that greatly increases image resolution by using luminance pixels. Other CFA implementations of a similar nature, in addition to those of FIGS. 3 and 4 will be obvious to one skilled in the art.

Having described various embodiments of the invention, it will be appreciated that although certain components and process steps have been described the descriptions are representative only; other functional delineations or additional steps and components can be added by one of skill in the art, and thus the present invention should not be limited to the specific embodiments disclosed. The various representational elements may be implemented in hardware, software running on a computer, or a combination thereof and modification to and variation of the illustrated embodiments may be made without departing from the inventive concepts herein disclosed. Accordingly, the invention should not be viewed as limited except by the scope and spirit of the appended claims.

The invention claimed is:

1. A pixel array comprising:
   a pixel;
   a single pixel luminance filter positioned over the pixel, the single pixel luminance filter comprising a plurality of colors, wherein the size of each of the colors of the single pixel luminance filter is proportional to a share of the associated color of the single pixel luminance filter that is used to calculate a luminance value for the pixel, and wherein the luminance value for the pixel is determined using only filtered electromagnetic radiation received through the single pixel luminance filter.

2. The pixel of claim 1 including an image sensor, coupled to receive a luminance filtered electromagnetic radiation signal from the single pixel luminance filter, and to provide an output indicative of a luminance of an input electromagnetic radiation signal.

3. The pixel of claim 1, wherein the plurality of colors include red, green and blue, and wherein the green filter comprises 70% of the single pixel luminance filter, the red filter comprises 20% of the single pixel luminance filter and the blue filter comprises 10% of the single pixel luminance filter.

4. A color filter array comprising:
   a luminance pixel, the luminance pixel comprising a single pixel luminance filter including a plurality of colors, wherein the size of each of the colors of the single pixel luminance filter is proportional to a share of the color used when calculating a luminance value of the luminance pixel, and wherein the luminance value is determined using only filtered electromagnetic radiation received through the single pixel luminance filter.

5. The color filter array of claim 4 wherein the luminance pixel includes an image sensor, coupled to receive a luminance filtered electromagnetic radiation signal from the single pixel luminance filter, and to provide an output indicative of a luminance of an input electromagnetic radiation signal.

6. The color filter array of claim 4, wherein the plurality of colors include red, green and blue, and wherein the green filter comprises 70% of the single pixel luminance filter, the red filter comprises 20% of the single pixel luminance filter and the blue filter comprises 10% of the single pixel luminance filter.

7. The color filter array of claim 4, further comprising:
   a plurality of luminance pixels; and
   a plurality of chroma pixels, wherein each chroma pixel is adjacent to the at least two luminance pixels.

8. The color filter array of claim 7, wherein each chroma pixel is adjacent to at least four luminance pixels.

9. The color filter array of claim 8, wherein the luminance pixels surround each of the plurality of chroma pixels.

* * * * *